(12) United States Patent
Jeon et al.

(10) Patent No.: US 11,616,116 B2
(45) Date of Patent: Mar. 28, 2023

(54) DISPLAY DEVICE INCLUDING DUMMY LINES OVERLAPPING CONNECTION LINES

(71) Applicant: Samsung Display Co., LTD., Yongin-si (KR)

(72) Inventors: Yu-Jin Jeon, Hwaseong-si (KR); Dae Suk Kim, Seongnam-si (KR); Jun-Yong An, Asan-si (KR); Won Se Lee, Seoul (KR); Dong Hyeon Jang, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/919,421

(22) Filed: Jul. 2, 2020

(65) Prior Publication Data

US 2021/0005704 A1  Jan. 7, 2021

(30) Foreign Application Priority Data

Jul. 3, 2019  (KR) ........................ 10-2019-0080159

(51) Int. Cl.
*G09G 3/32* (2016.01)
*H01L 27/32* (2006.01)

(52) U.S. Cl.
CPC ........... *H01L 27/3279* (2013.01); *G09G 3/32* (2013.01); *H01L 27/3223* (2013.01); *H01L 27/3265* (2013.01); *G09G 2320/0233* (2013.01)

(58) Field of Classification Search
CPC ......... G01R 31/00; G02F 1/13; G02F 1/1345; G09G 3/3611; G09G 3/32; G09G 3/30; G09G 3/34; G09G 3/36; G09G 5/00; H01L 22/14; H01L 33/0041; H01L 27/3223; H01L 27/3265; G06F 3/038

See application file for complete search history.

(56) References Cited

U.S. PATENT DOCUMENTS

| | | | | |
|---|---|---|---|---|
| 5,982,470 | A * | 11/1999 | Nakahara | G02F 1/1345 349/153 |
| 2003/0179334 | A1* | 9/2003 | Kang | G02F 1/1345 349/139 |
| 2012/0281369 | A1* | 11/2012 | Chen | G02F 1/1345 361/748 |
| 2018/0197484 | A1* | 7/2018 | Moon | H01L 27/3248 |
| 2018/0211982 | A1* | 7/2018 | Wang | G02F 1/136286 |
| 2019/0051670 | A1* | 2/2019 | Bei | H01L 27/3276 |

FOREIGN PATENT DOCUMENTS

| KR | 1019980011944 A | 4/1998 |
|---|---|---|
| KR | 100516579 B1 | 9/2005 |
| KR | 101247023 B1 | 3/2013 |
| KR | 1020160069627 A | 6/2016 |
| KR | 1020160095300 A | 8/2016 |
| KR | 1020170020640 A | 2/2017 |
| KR | 1020170068796 A | 6/2017 |

* cited by examiner

*Primary Examiner* — Pegeman Karimi
(74) *Attorney, Agent, or Firm* — Cantor Colburn LLP

(57) ABSTRACT

A display device includes a display panel that has a display area displaying an image and a non-display area around the display area. The display panel includes: a substrate; a plurality of connection lines on the substrate in the non-display area and including a first connection line and a second connection line adjacent to each other; a first dummy line overlapping and disposed on the first connection line; and a second dummy line overlapping the second connection line and disposed between the substrate and the second connection line.

17 Claims, 10 Drawing Sheets

DISPLAY DEVICE INCLUDING DUMMY LINES OVERLAPPING CONNECTION LINES

This application claims priority to Korean Patent Application No. 10-2019-0080159, filed on Jul. 3, 2019, and all the benefits accruing therefrom under 35 U.S.C. § 119, the content of which in its entirety is herein incorporated by reference.

BACKGROUND

(a) Field

This disclosure relates to a display device.

(b) Description of the Related Art

Display devices, such as an emissive display device, a liquid crystal display and the like, may include a display panel including pixels for displaying an image. The pixels may be disposed in the display area of the display panel corresponding to a screen of the display device, and signal transmitting lines for transmitting signals to be applied to the display area are disposed in a non-display area adjacent to the display area of the display panel. In the display area, transistors including a semiconductor layer are typically provided.

SUMMARY

In display device, the density of the semiconductor layer in a non-display area may be drastically reduced near a boundary of the display area and the non-display area. In addition, the density of a specific conductive layer may be drastically reduced in the non-display areas. As a result, the semiconductor pattern or the conductive pattern of the display area adjacent to the non-display area may be formed with an unintended width (e.g., the width becomes wider than the design). This may lead to defects (e.g., spot) in the image displayed on the screen such as the luminance of a specific color or a specific portion being increased or decreased.

Embodiments of the invention relate to a display device in which display quality deterioration depending on a density difference of the semiconductor layer and the conductive layer in the display area and the non-display area of a display device is effectively prevented.

According to an embodiment of the invention, a display device includes a display panel including a display area, in which an image is displayed, and a non-display area around the display area. In such an embodiment, the display panel includes: a substrate; a plurality of connection lines on the substrate in the non-display area and including a first connection line and a second connection line adjacent to each other; a first dummy line overlapping the first connection line and disposed on the first connection line; and a second dummy line overlapping the second connection line and disposed between the substrate and the second connection line.

In an embodiment, the first dummy line may not overlap the second connection line, and the second dummy line may not overlap the first connection line.

In an embodiment, the display panel may further include a first insulating layer disposed between the first connection line and the second dummy line.

In an embodiment, the display panel may further include a second insulating layer disposed between the first connection line and the second connection line.

In an embodiment, the display panel may further include a third insulating layer disposed between the second connection line and the first dummy line.

In an embodiment, the first dummy line may be connected to the first connection line through a contact hole defined in the second insulating layer and the third insulating layer.

In an embodiment, the second connection line may be connected to the second dummy line through a contact hole defined in the first insulating layer and the second insulating layer.

In an embodiment, the display panel may further include a semiconductor layer disposed between the substrate and the first insulating layer in the display area, and the second dummy line may include a same material as the semiconductor layer.

In an embodiment, the display panel may further include a storage capacitor disposed in the display area, the storage capacitor may include a first electrode disposed between the first insulating layer and the second insulating layer and a second electrode disposed between the second insulating layer and the third insulating layer, the first connection line may include a same material as the first electrode, and the second connection line may include a same material as the second electrode.

In an embodiment, the display panel may further include: an initialization voltage line disposed on the third insulating layer in the display area, where the initialization voltage line may transmit an initialization voltage; and a fourth insulating layer disposed on the initialization voltage line and the first dummy line, and the first dummy line may include a same material as the initialization voltage line.

In an embodiment, the display panel may further include a data line disposed on the fourth insulating layer in the display area, where the data line may transmits a data voltage, one of the first connection line and the second connection line may be connected to the data line.

In an embodiment, the display panel may further include a scan line disposed between the first insulating layer and the second insulating layer in the display area, where the scan line may transmit a scan signal, and one of the first connection line and the second connection line may be connected to the initialization voltage line and the other of the first connection line and the second connection line may be connected to the scan line.

In an embodiment, the plurality of connection lines may further include a third connection line adjacent to the second connection line, and the display panel may further include a third dummy line overlapping the third connection line and disposed between the substrate and the third connection line.

In an embodiment, the display panel may further include a light emission control line disposed between the first insulating layer and the second insulating layer in the display area, where the light emission control line may transmit a light emission control signal, and the third connection line may be connected to the light emission control line.

In an embodiment, the first dummy line and the second dummy line may be alternately disposed one by one in a predetermined direction.

According to an embodiment of the invention, a display device includes a display panel including a display area and a non-display area. In such an embodiment, the display panel includes: a substrate; a first insulating layer disposed on the substrate; a first connection line disposed on the first insulating layer in the non-display area; a second insulating layer disposed on the first connection line; a second connection line disposed on the second insulating layer in the non-display area; a third insulating layer disposed on the second connection line; a fourth insulating layer disposed on the third insulating layer; a first dummy line overlapping the first connection line; and a second dummy line overlapping the second connection line.

In an embodiment, the first dummy line may be disposed between the third insulating layer and the fourth insulating layer, and the second dummy line may be disposed between the substrate and the first insulating layer.

In an embodiment, the first dummy line may be connected to the first connection line, and the second dummy line may be connected to the second connection line.

In an embodiment, the display device may further include an integrated circuit chip including a data driver, and the first connection line and the second connection line may transmit a data voltage output from the integrated circuit chip.

In an embodiment, the display device may further include a driving circuit disposed in the non-display area, and at least one line selected from the first connection line and the second connection line may transmit a signal output from the driving circuit.

According to embodiments, a photo-loading effect due to a density difference of the semiconductor layer and the conductive layer in the display area and the non-display area may be resolved, thereby improving display quality deterioration.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
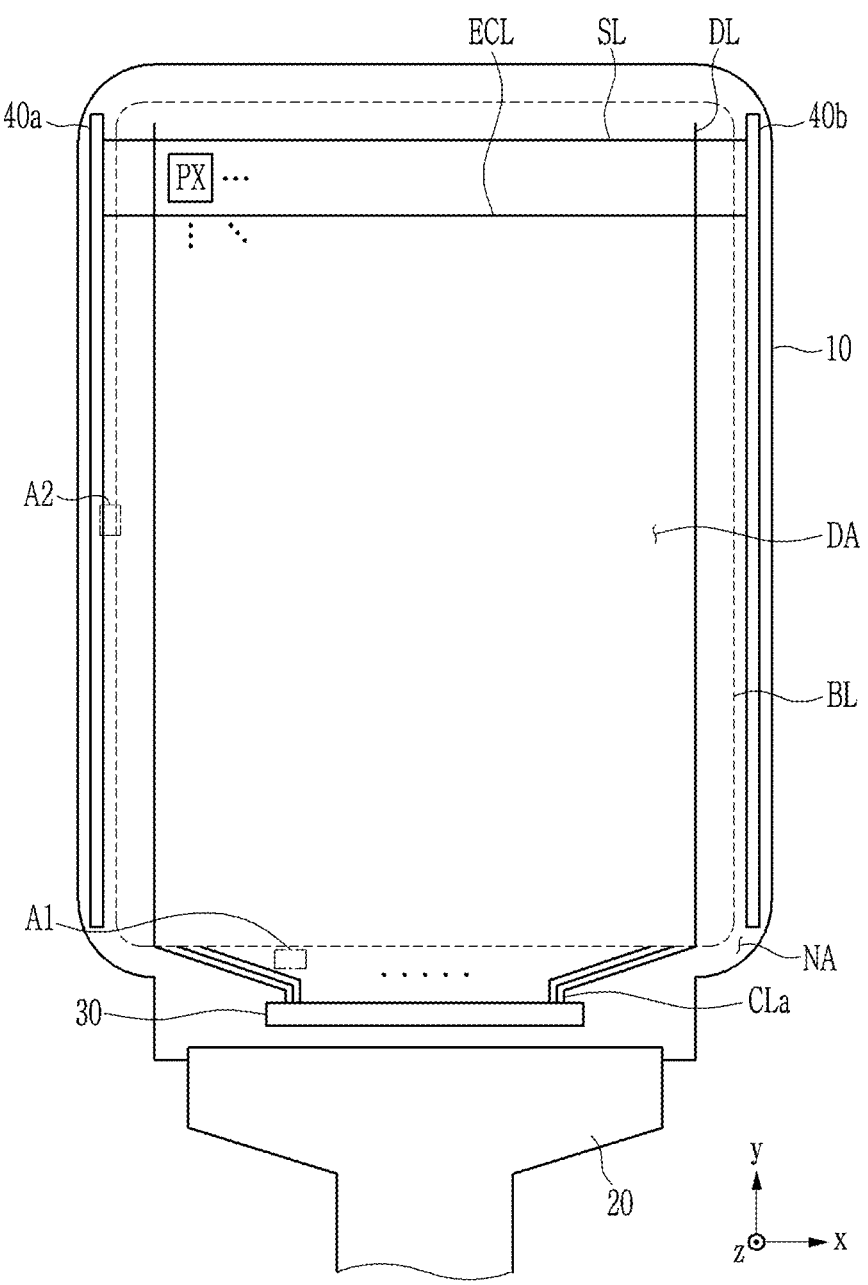
FIG. 1 is a top plan view schematically showing a display device according to an embodiment.

The invention will be described more fully hereinafter with reference to the accompanying drawings, in which embodiments of the inventive concept are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

Further, in the drawings, a size and thickness of each element are arbitrarily represented for better understanding and ease of description, and the invention is not limited thereto. In the drawings, the thickness of layers, films, panels, regions, etc., are exaggerated for clarity. In the drawings, for better understanding and ease of description, the thickness and/or the width of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, in the specification, the phrase "on a plane" means viewing the object portion from the top, and the phrase "on a cross-section" means viewing a cross-section of which the object portion is vertically cut from the side.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawing, a reference character x is used to indicate a first direction, a reference character y is a second direction that is perpendicular to the first direction, and a reference character z is a third direction that is perpendicular to the first direction and the second direction.

Hereinafter, embodiments of the invention will be described in detail with reference to the accompanying drawings.

FIG. 1 is a top plan view schematically showing a display device according to an embodiment.

Referring to FIG. 1, an embodiment of a display device includes a display panel 10. The display panel 10 includes a display area DA for displaying an image, and a non-display area NA in which elements and/or wires for generating and/or transmitting various signals to be applied to the display area DA are disposed or formed around the display area DA. The display area DA may be defined as an area inside of an imaginary boundary BL indicated by a dotted line, and the non-display area NA may be defined as an area outside of the boundary BL.

Pixels PX, for example, are disposed in a matrix form in the display area DA of the display panel 10. Signal lines such as data lines DL and scan lines (also referred to as gate lines) SL are also disposed in the display area DA. The scan lines SL may extend substantially in a first direction x (e.g., a row direction), and the data lines DL may extend substantially in a second direction y (e.g., a column direction) crossing the first direction x. Each pixel PX is connected to the scan line SL and the data line DL, thereby receiving a scan signal (referred to as a gate signal) and a data voltage (referred to as a data signal) from such signal lines. In an embodiment where the display device is an organic light emitting diode display, driving voltage lines for transmitting a driving voltage ELVDD to the pixels PX may be disposed and light emission control lines ECL for transmitting a light emission control signal and/or initialization voltage lines for transmitting an initialization voltage may be further disposed in the display area DA. The driving voltage lines may extend substantially in the second direction y, and the light emission control lines ECL and/or the initialization voltage lines may substantially extend in the first direction x.

The display panel 10 may include touch electrodes (also referred to as a touch sensor layer) for sensing a contact thereon by a user or an input device (e.g., a pen) or non-contact touch thereon, and the touch electrodes may be disposed mainly in the display area DA. In an embodiment, as shown in FIG. 1, the display area DA may have a quadrangle shape with rounded corners, but the shape of the display area DA may be variously modified to have one of various shapes such as rectangles, other polygons, circles, and ellipses.

In the non-display area NA of the display panel 10, a pad portion including pads for receiving the signals from an outside of the display panel 10 may be disposed. The display device may include a flexible printed circuit film 20 including an end connected (e.g., bonded) to the pad portion of the display panel 10. Another end of the flexible printed circuit film 20 is connected to the printed circuit board ("PCB"), thereby receiving the signals such as image data, and power voltages such as a driving voltage ELVDD, a common voltage ELVSS, etc.

A driving device (e.g., a circuit) for generating and/or processing the various signals to drive the display panel 10 may be disposed in the non-display area NA, and may be disposed on a flexible printed circuit film 20 connected to the pad portion. The driving device may include a data driver for applying a data voltage to the data lines DL, a scan driver for applying a scan signal to the scan lines SL, an light emission driver for applying a light emission control signal to the light emission control lines ECL, and a signal controller for controlling the data driver, the scan driver and the light emission driver.

The scan driver and the light emission driver may be integrated as driving circuits 40a and 40b in the non-display area NA of the display panel 10. The driving circuits 40a and 40b may include a driving circuit 40a disposed at an side of the display area DA and a driving circuit 40b disposed at an opposing side of the display area DA, and the driving circuits 40a and 40b may each extend in the second direction y. Each driving circuit 40a or 40b may include a scan driver and/or a light emission driver. The driving circuits 40a and 40b may be electrically connected to the scan lines SL and the light emission control lines ECL. The driving circuit 40a or 40b may include a shift register including stages that are dependently connected (e.g., connected in cascade) to each other, and each stage may include a transistor and a capacitor. Each stage may receive the driving circuit signals to generate and/or output the gate signals and/or the light emission control signals.

The data driver and signal controller may be provided with an integrated circuit chip 30 or defined by portions of the integrated circuit chip 30. The integrated circuit chip 30 may be disposed in the non-display area NA of the display panel 10. The integrated circuit chip 30 may be disposed on the flexible printed circuit film 20. The data driver and the signal controller may be formed as a single chip or as separate chips.

In the non-display area NA, data connection lines CLa for transmitting the data voltages output from the integrated circuit chip 30 to the data lines DL of the display area DA may be disposed between the integrated circuit chip 30 and the display area DA. In an embodiment, the number of the data connection lines CLa may be thousands, for example depending on the resolution of the display device. In such an embodiment, since a large number of such data connection lines CLa may be formed in a limited region or area, the data connection lines CLa may be formed and disposed with a very narrow width and interval of a micrometer unit. The data connection lines CLa may include a portion extending in a direction that is inclined with respect to the second direction y, and the interval between the adjacent data connection lines CLa in such a portion may be very narrow (for example, less than 1 micrometer).

Figure 2:
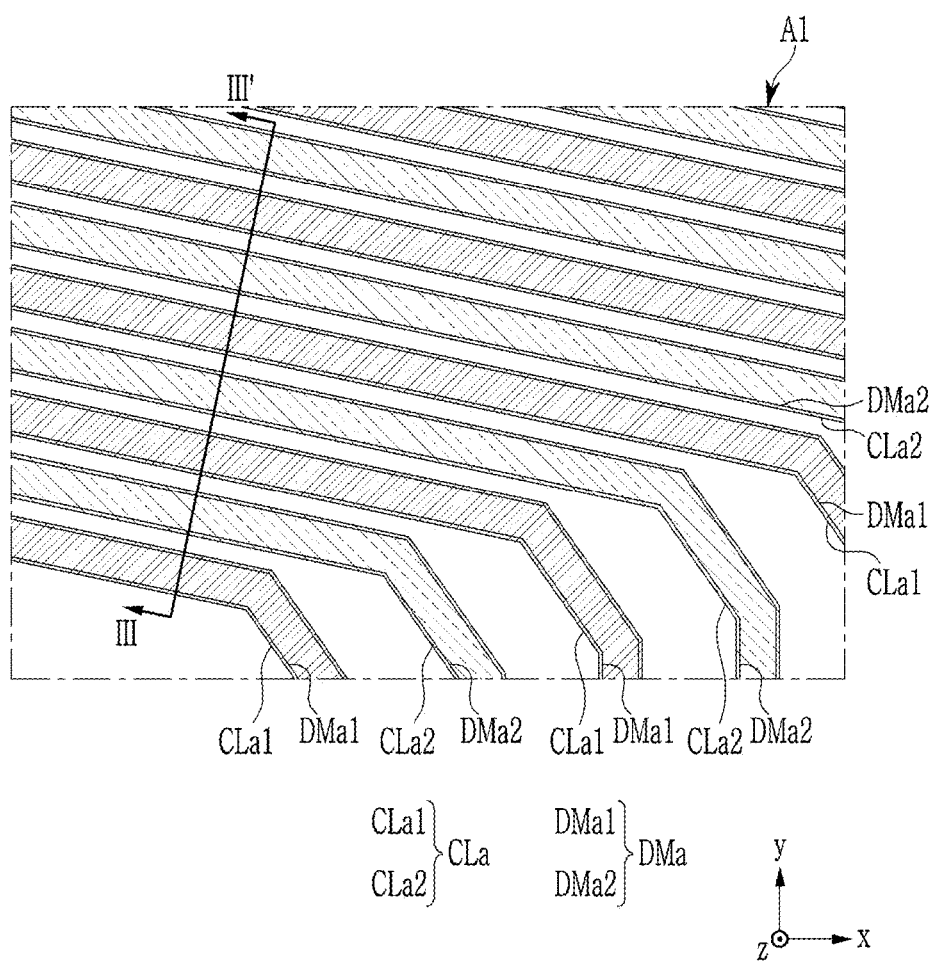
FIG. 2 is an enlarged view of a region A1 in FIG. 1.
Figure 3:
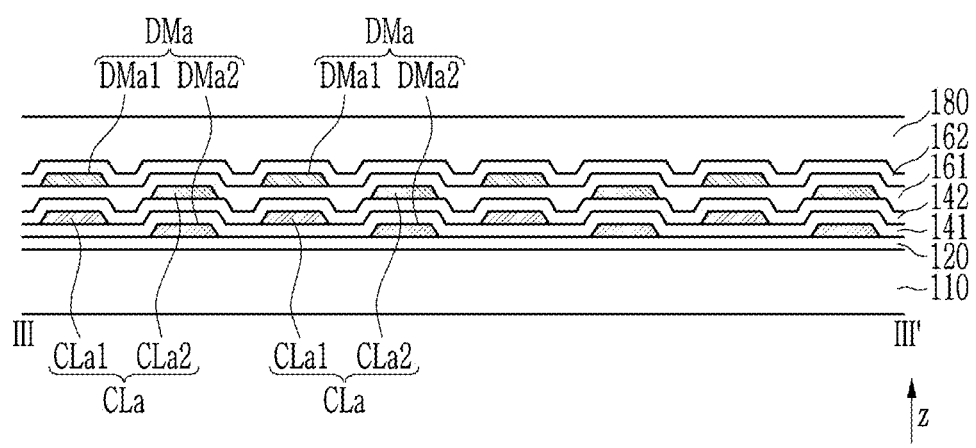
FIG. 3 is a cross-sectional view taken along line III-III' of FIG. 2.

FIG. 2 is an enlarged view of a region A1 in FIG. 1, and FIG. 3 is a cross-sectional view taken along line III-III' of FIG. 2.

Referring to FIG. 2 and FIG. 3, in the non-display area DA, the data connection lines CLa disposed between the integrated circuit chip 30 and the display area DA are shown. Generally, since the width of the display area DA is larger than the width of the integrated circuit chip 30, at least part of the data connection lines CLa may include the portion extending obliquely with respect to the second direction y.

The data connection lines CLa may include a first data connection line CLa1 and a second data connection lines CLa2 that are disposed in different layers from each other. The first data connection line CLa1 and the second data connection line CLa2 may be alternately placed in the first direction x and/or the second direction y. If the first data connection line CLa1 and the second data connection line CLa2 disposed in different layers are disposed, the interval between the first and second data connection lines CLa1 and CLa2 may be allowed to be reduced while increasing the width of each of the first and second data connection lines CLa1 and CLa2.

A first dummy line DMa1 overlapping the first data connection line CLa1 may be disposed on the first data connection line CLa1. A second dummy line DMa2 overlapping the second data connection line CLa2 may be disposed under the second data connection line CLa2. Similarly to the first data connection line CLa1 and the second data connection line CLa2, the first dummy line DMa1 and the second dummy line DMa2 may be alternately arranged one by one in the first direction x and/or the second direction y. The first dummy line DMa1 may be connected to the first data connection line CLa1, and the potential of the first dummy line DMa1 may be the same as the potential of the first data connection line CLa1. The second dummy line DMa2 may be connected to the second data connection line CLa2, and the potential of the second dummy line DMa2 may be the same as the potential of the second data connection line CLa2. Accordingly, the resistance of the first data connection line CLa1 and the second data connection line CLa2 may be reduced and resistance-capacitance ("RC") delay of the signal such as the data voltage transmitted through the first data connection line CLa1 and the second data connection line CLa2 may be reduced. The first dummy line DMa1 and/or the second dummy line DMa2 may be electrically floating.

The first dummy line DMa1 is provided to resolve a problem that a dimension becomes non-uniform due to a photo-loading effect when forming the conductive pattern of the display area DA as a density (an area occupied by the conductive layer per unit area) of the conductive layer is changed in the display area DA and the non-display area NA. Similarly, the second dummy line DMa2 is provided to resolve the problem of the non-uniformity of the dimension due to the photo-loading effect when forming the semiconductor pattern of the display area DA as the density of the semiconductor layer (i.e., the area occupied by the semiconductor layer per unit area) differs in the display area DA and the non-display area NA.

For example, when forming the semiconductor pattern configuring the transistors of the display area DA, a semiconductor material is entirely deposited on a substrate 110 (i.e., over the display area DA and the non-display area NA) to form the semiconductor layer, and the semiconductor layer may be patterned through a photolithography process. The photolithography process includes processes for coating a photosensitive material such as a photoresist on the semiconductor layer, exposing the photosensitive material by using a mask, and then partially dissolving the photosensitive material by a developer to form a photosensitive film pattern corresponding to the pattern of the mask. In this case, if the density difference of the semiconductor pattern to be formed in the display area DA and the non-display area NA adjacent thereto is large, the developer in the display area DA is likely to flow toward the non-display area NA. The flow of the developer changes a developing speed in the region particularly adjacent to the non-display area NA among the display area DA, such that the dimension increase of the semiconductor pattern formed in the display area DA adjacent to the non-display area NA may occur, and problems such as a luminance increase may occur at the edges of the display area.

In an embodiment, the second dummy line DMa2 is provided or formed in the non-display area NA adjacent to the display area DA, such that the rapid change of the density difference of the semiconductor layer may be smoothed between the display area DA and the non-display area NA, and accordingly the non-uniformity of the dimension of the semiconductor pattern may be improved by reducing the developer flow when forming the semiconductor pattern. Since the second dummy line DMa2 is not formed under the first data connection line CLa1 and is only formed under the second data connection line CLa2, the adjacent second dummy lines DMa2 may be disposed with a wider interval than the interval between the adjacent first data connection line CLa1 and second data connection line CLa2. Therefore, even if a process error occurs, for example, a short may not occur between the adjacent second dummy lines DMa2. In such an embodiment, the first dummy line DMa1 is provided or formed in the non-display area NA adjacent to the display area DA, such that the rapid change of the density difference of the conductive layer between the display area DA and the non-display area NA may be mitigated, and the dimension non-uniformity of the conductive pattern may be improved by reducing the developer flow. Since the first dummy line DMa1 is not formed on the second data connection line CLa2 and is only formed on the first data connection line CLa1, the adjacent first dummy lines DMa1 may be formed with the wider interval than the interval between the adjacent first data connection line CLa1 and the second data connection line CLa2, and accordingly, the short between the adjacent first dummy lines DMa1 may not occur. The conductive layer (the conductive pattern) of the display area DA disposed in a same layer as the first dummy line DMa1 will described later in greater detail.

Hereinafter, the stacked structure (the cross-sectional structure) of the region where the data connection line CLa and the dummy line DMa are disposed will be described in detail with reference to FIG. 3. In the stacked structure, the substrate 110 may be formed of a plastic such as polyimide or an insulating material such as a glass.

A buffer layer 120 may be disposed on the substrate 110. The buffer layer 120 serves as a layer of blocking an impurity that may be diffused from the substrate 110 to the semiconductor layer thereon in the process of forming the semiconductor layer and reducing a stress applied to the substrate 110. The buffer layer 120 may increase the adhesion force of the semiconductor layer. The buffer layer 120 is an insulating layer, while being referred to as a buffer layer in consideration of its functional aspects. The buffer layer 120 may include an inorganic insulating material such as a silicon oxide ($SiO_x$), a silicon nitride ($SiN_x$), etc.

A second dummy line DMa2 may be disposed on the buffer layer 120. The second dummy line DMa2 may include a polysilicon, an amorphous silicon, or an oxide semiconductor.

A first insulating layer 141 may be disposed on the second dummy line DMa2. The first insulating layer 141 may include the inorganic insulating material such as a silicon oxide and a silicon nitride. The first insulating layer 141 may be referred to as a first gate insulating layer.

The first data connection line CLa1 may be disposed on the first insulating layer 141. The first data connection line CLa1 may include a metal such as molybdenum (Mo), copper (Cu), aluminum (Al), silver (Ag), chromium (Cr), tantalum (Ta) or titanium (Ti), for example.

A second insulating layer 142 that may include an inorganic insulating material such as silicon oxide or silicon nitride may be disposed on the first data connection line CLa1. The second insulating layer 142 may be referred to as a second gate insulating layer.

A second data connection line CLa2 may be disposed on the second insulating layer 142. The second data connection line CLa2 and the first data connection line CLa1 are insulated from each other by the second insulating layer 142 interposed therebetween. Therefore, even if the interval between the adjacent first data connection line CLa1 and the second data connection line CLa2 is very narrow, the first data connection line CLa1 and the second data connection line CLa2 may not be shorted, so the widths of the first data connection line CLa1 and the second data connection line CLa2 may be allowed to be increased to reduce the resistance.

The second data connection line CLa2 may overlap the second dummy line DMa2. The second data connection line CLa2 may be connected to the second dummy line DMa2 through at least one contact hole defined or formed in the first and second insulating layers 141 and 142. The second data connection line CLa2 may include a metal such as molybdenum (Mo), copper (Cu), aluminum (Al), silver (Ag), chromium (Cr), tantalum (Ta) or titanium (Ti), for example.

A third insulating layer 161 that may include an inorganic insulating material such as a silicon oxide and a silicon nitride may be disposed on the second data connection line CLa2. The third insulating layer 161 may be referred to as a first interlayer insulating layer.

A first dummy line DMa1 may be disposed on the third insulating layer 161. The first dummy line DMa1 may overlap the first data connection line CLa1. The first dummy line DMa1 may be connected to the first data connection line CLa1 via at least one contact hole formed in the second and third insulating layers 142 and 161. The first dummy line DMa1 may include a metal such as molybdenum (Mo), copper (Cu), aluminum (Al), silver (Ag), chromium (Cr), tantalum (Ta) or titanium (Ti), for example.

A fourth insulating layer 162 that may include an inorganic insulating material such as a silicon oxide and a silicon nitride may be disposed on the first dummy line DMa1. The fourth insulating layer 162 may be referred to as a second interlayer insulating layer.

A fifth insulating layer 180 may be disposed on the fourth insulating layer 162. The fifth insulating layer 180 may include an organic insulating material such as polyimide, an acryl-based polymer or a siloxane-based polymer. The fifth insulating layer 180 may be referred to as a passivation layer, a polarization layer, or the like.

Figure 4:
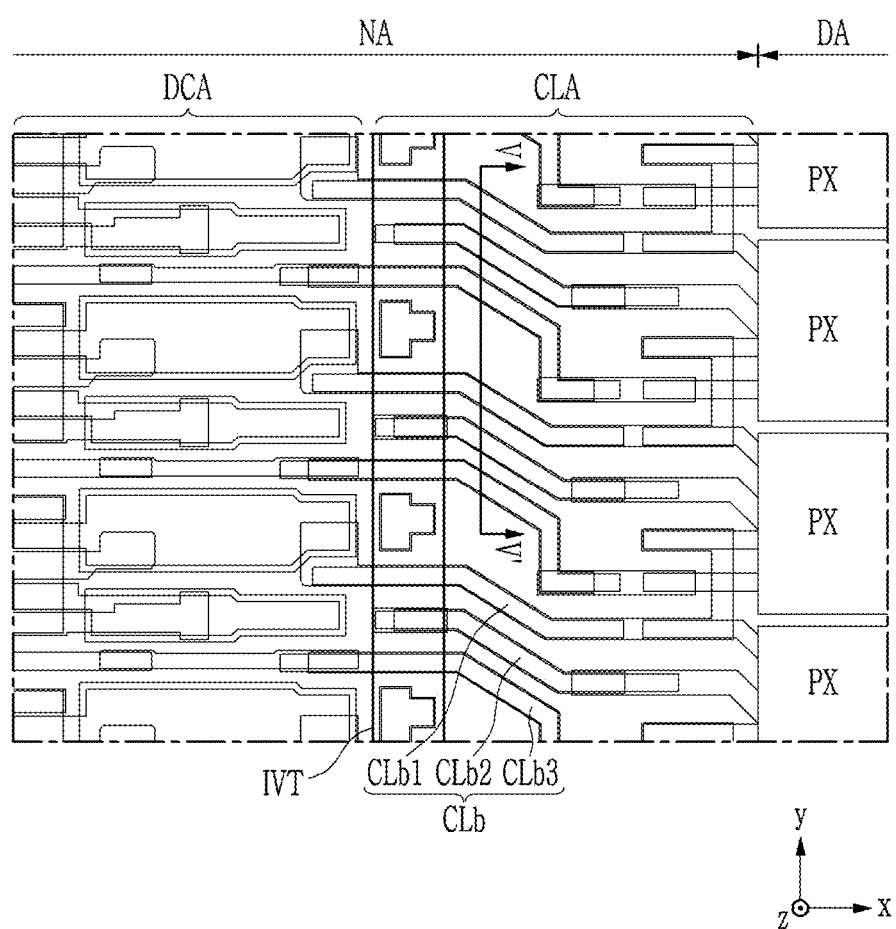
FIG. 4 is an enlarged view of a region A2 in FIG. 1.
Figure 5:
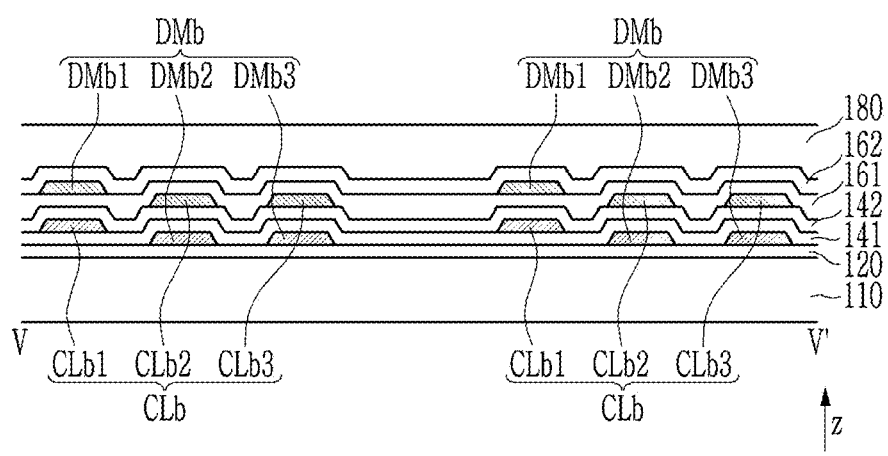
FIG. 5 is a cross-sectional view taken along line V-V' of FIG. 4.

FIG. 4 is an enlarged view of a region A2 in FIG. 1, and FIG. 5 is a cross-sectional view taken along line V-V' of FIG. 4.

In FIG. 4, a portion of the non-display area NA where the driving circuit 40a is disposed is shown. A connection line area CLA, where a driving connection line CLb connecting the driving circuit 40a and/or the voltage transmitting line to the signal lines of the display area DA is disposed, is disposed between the driving circuit area DCA, where the driving circuit 40a is disposed, and the display area DA.

The driving connection line CLb may include a first driving connection line CLb1, a second driving connection line CLb2, and a third driving connection line CLb3. The first driving connection line CLb1 may connect the driving circuit 40a and the scan line SL of the display area DA to each other, and may transmit the scan signal output from the driving circuit 40a to the scan line SL. The second driving connection line CLb2 may connect the initialization voltage transmitting line IVT and the initialization voltage line of the display area DA to each other, and may transfer the initialization voltage Vint to the initialization voltage line. The third driving connection line CLb3 may connect the driving circuit 40a and the light emission control line ECL of the display area DA, and may transmit the light emission control signal to the light emission control line ECL. Such three driving connection lines CLb1, CLb2, and CLb3 may correspond to one pixel row, and may be repeated in the second direction y.

Referring to FIG. 4 and FIG. 5, the first driving connection line CLb1 may be disposed between the first insulating layer 141 and the second insulating layer 142, and the second driving connection line CLb2 and the third driving connection line CLb3 may be disposed between the second insulating layer 142 and the third insulating layer 161. A first dummy line DMb1 overlapping the first driving connection line CLb1 may be disposed on the first driving connection line CLb1. A second dummy line DMb2 overlapping the second driving connection line CLb2 may be disposed under the second driving connection line CLb2. A third dummy line DMb3 overlapping the third driving connection line CLb3 may be disposed under the third driving connection line CLb3. The first to third dummy lines DMb1 to DMb3 may collectively define a dummy line DMb corresponding to a driving connection line CLb.

The first dummy line DMb1 may be connected to the first driving connection line CLb1 through the contact hole defined or formed in the second and third insulating layers 142 and 161, and the potential of the first dummy line DMb1 may be the same as the potential of the first driving connection line CLb1. The second driving connection line CLb2 may be connected to the second dummy line DMb2 through the contact hole defined or formed in the first and second insulating layers 141 and 142, and the potential of the second dummy line DMb2 may be the same as the potential of the second driving connection line CLb2. The third driving connection line CLb3 may be connected to the third dummy line DMb3 through the contact hole defined or formed in the first and second insulating layers 141 and 142, and the potential of the third dummy line DMb3 may be the same as the potential of the third driving connection line CLb3. Accordingly, the resistance of the first driving connection line CLb1, the second driving connection line CLb2, and the third driving connection line CLb3 may be reduced and an RC delay of the signals transmitted through the first, second, and third driving connection lines CLb1, CLb2, and CLb3 may be reduced. Alternatively, the first dummy line DMb1, the second dummy line DMb2, and/or the third dummy line DMb3 may be an electrically floating line.

In an embodiment, as described above, by disposing the first, second, and third dummy lines DMb1, DMb2 and DMb3 to directly overlap the first, second and third driving connection lines CLb1, CLb2, and CLb3, respectively, when forming the semiconductor pattern and the conductive pattern of the display area DA, the problem of non-uniform dimensions due to the photo-loading effect may be resolved and the image deterioration such as spots on the edges of the display area DA may be reduced or effectively prevented.

An embodiment of a pixel PX of the display device will now be described with reference to FIG. 6, FIG. 7, and FIG. 8.

Figure 6:
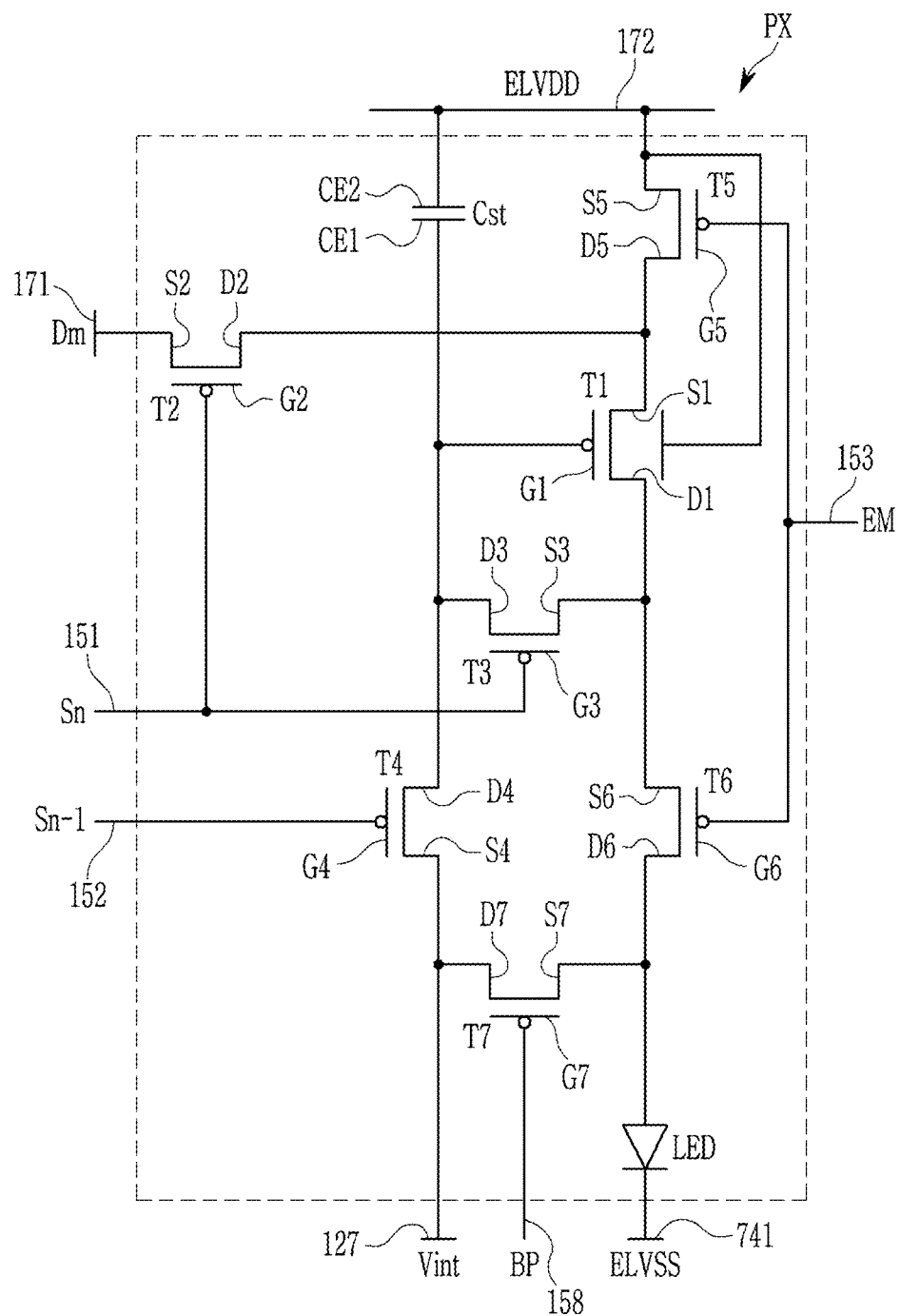
FIG. 6 is an equivalent circuit diagram of a pixel of a display device according to an embodiment.
Figure 7:
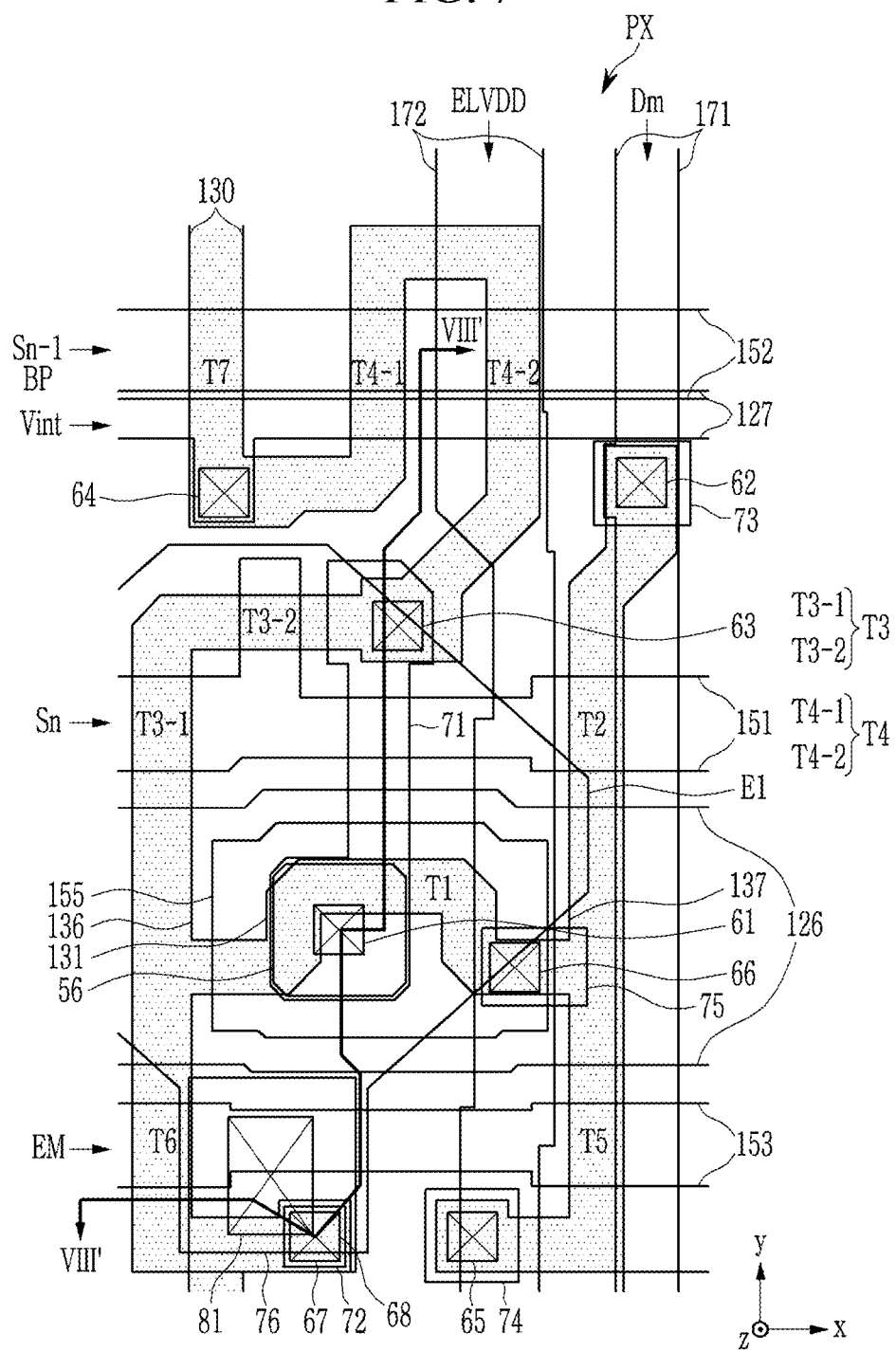
FIG. 7 is a plan view of a pixel area of a display device according to an embodiment.
Figure 8:
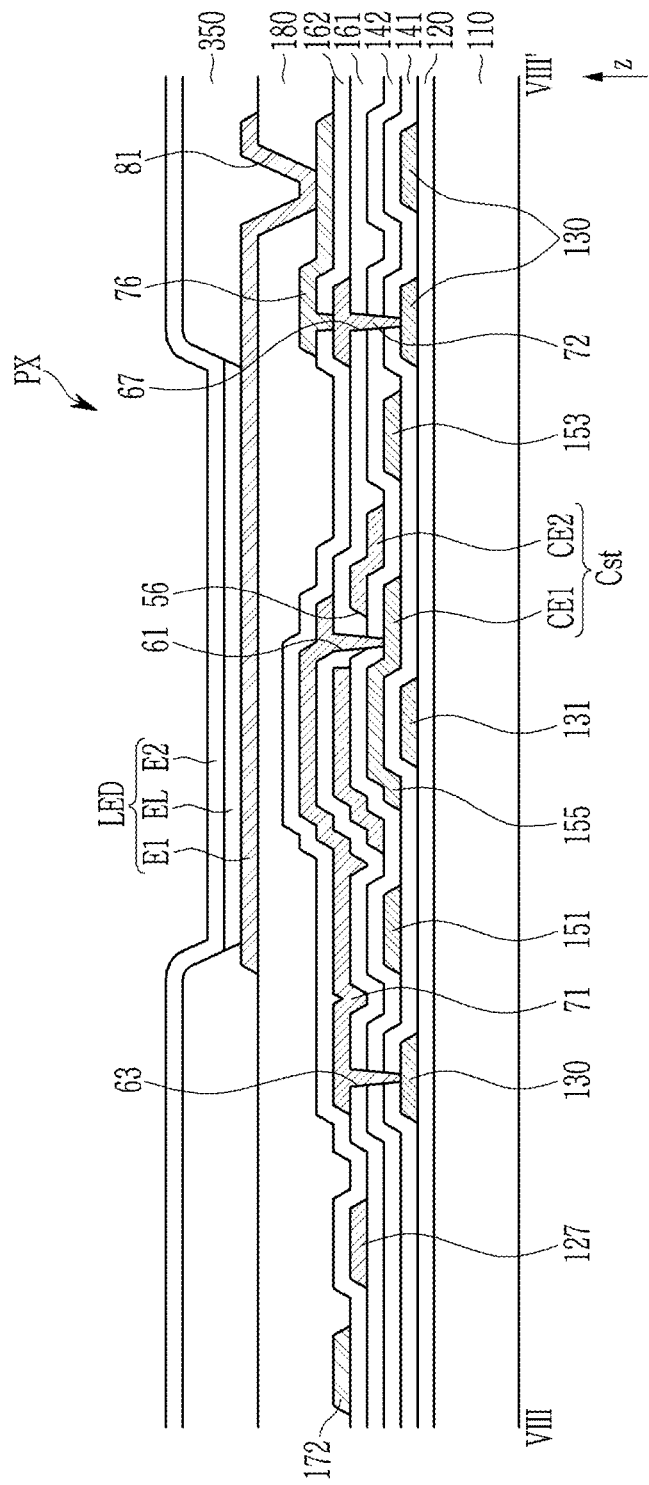
FIG. 8 is a cross-sectional view taken along line VIII-VIII' of FIG. 7.

FIG. 6 is an equivalent circuit diagram of a pixel PX of a display device according to an embodiment, FIG. 7 is a plan view of a pixel area of a display device according to an embodiment, and FIG. 8 is a cross-sectional view taken along line VIII-VIII' of FIG. 7.

Referring to FIG. 6, an embodiment of the pixel PX includes transistors T1 to T7, a storage capacitor Cst, and a light emitting diode LED, which are connected to signal lines 127, 151, 152, 153, 158, 171, and 172.

The transistors T1 to T7 includes a driving transistor T1, a switching transistor T2, a compensation transistor T3, an initialization transistor T4, an operation control transistor T5, a light emission control transistor T6, and a bypass transistor T7.

The signal lines 127, 151, 152, 153, 158, 171, and 172 may include an initialization voltage line 127, a scan line 151, a previous scan line 152, a light emission control line 153, a bypass control line 158, a data line 171, and a driving voltage line 172.

The previous scan line 152 transmits a previous scan signal Sn−1 to the initialization transistor T4, the light emission control line 153 transmits a light emission control signal EM to the operation control transistor T5 and the light emission control transistor T6, and the bypass control line 158 transmits a bypass signal BP to the bypass transistor T7.

The data line 171 may receive a data voltage Dm, and the driving voltage line 172 and the initialization voltage line 127 may receive a driving voltage ELVDD and an initialization voltage Vint, respectively. The initialization voltage Vint initializes the driving transistor T1.

Transistors T1 to T7 respectively include gate electrodes G1 to G7, source electrodes S1 to S7, and drain electrodes D1 to D7, and the storage capacitor Cst includes a first electrode CE1 and a second electrode CE2. The electrodes of these transistors T1 to T7 and the storage capacitor Cst may be connected as shown in FIG. 6. An anode of the light emitting diode LED, which may be an organic light emitting diode, is connected to the drain electrode D1 of the driving transistor T1 through the light emission control transistor T6, and a cathode of the light emitting diode LED is connected to a common voltage line 741 for transmitting a common voltage ELVSS.

The number of the transistors, the number of the capacitor, and the connections therebetween may be variously modified in the circuit structure of the pixel PX.

Referring to FIG. 7, the display device may include the scan line 151, the previous scan line 152, the light emission control line 153, and the initialization voltage line 127 which mainly extend in a first direction x and respectively transmit the scan signal Sn, the previous scan signal Sn−1, the light emission control signal EM, and the initialization voltage Vint. The bypass signal BP may be transmitted through the previous scan line 152. The display device may include the data line 171 and the driving voltage line 172 that mainly extend along a second direction y and respectively transmit the data voltage Dm and the driving voltage ELVDD. The scan signal Sn and the previous scan signal Sn−1 may be connected to two first driving connection lines CLb1 disposed in the above-described non-display area NA and adjacent to each other. The light emission control line 153 may be connected to the third driving connection line CLb3. The initialization voltage line 127 may be connected to the second driving connection line CLb2. The data line 171 may be connected to the first data connection line CLa1 or the second data connection line CLa2.

The display device may include the driving transistor T1, the switching transistor T2, the compensation transistor T3, the initialization transistor T4, the operation control transistor T5, the light emission control transistor T6, the bypass transistor T7, the storage capacitor Cst, and the light emitting diode LED. The light emitting diode LED includes a first electrode E1, an emission layer EL, and a second electrode E2. The compensation transistor T3 and the initialization transistor T4 may each have a dual gate structure to prevent a leakage current, that is, a structure in which a first compensation transistor T3-1 and a second compensation transistor T3-2 are connected to each other and a first initialization transistor T4-1 and a second initialization transistor T4-2 are connected to each other.

Each channel, source electrode, and drain electrode of the driving transistor T1, the switching transistor T2, the compensation transistor T3, the initialization transistor T4, the operation control transistor T5, the light emission control transistor T6, and the bypass transistor T7 may be disposed in a same semiconductor layer 130 that is elongated. The semiconductor layer 130 may be bent into various shapes. The semiconductor layer 130 may include a polycrystalline semiconductor such as a polysilicon or an oxide semiconductor.

The semiconductor layer 130 may include a channel doped with an N-type impurity or a P-type impurity, and a source doping region and a drain doping region disposed on respective sides of the channel and having higher doping concentrations than the channel. The source doping region and the drain doping region correspond to the source and drain electrodes of each of the transistors T1 to T7, respectively. Also, in the semiconductor layer 130, a region between the source electrode and the drain electrode of different transistors may be doped, so that the source electrode of one transistor and the drain electrode of the other transistor may be electrically connected to each other.

The channel of each of the transistors T1 to T7 overlaps the gate electrode thereof and is disposed between the source and drain electrodes thereof. Each of the transistors T1 to T7 may have substantially a same lamination structure. Therefore, for convenience of description, a structure of the driving transistor T1 will hereinafter be mainly described, and any repetitive detailed description of structures of the remaining transistors T2 to T7 will be omitted or simplified.

The driving transistor T1 includes a channel 131, a gate electrode 155, a source electrode 136, and a drain electrode 137. The channel 131 overlaps the gate electrode 155 between the source electrode 136 and the drain electrode 137. The gate electrode 155 overlaps the channel 131. The source electrode 136 and the drain electrode 137 are adjacent to both sides of the channel 131, respectively. A connecting member 71 is connected to the gate electrode 155 via a contact hole 61. For such a connection between the connecting member 71 and the gate electrode 155, an opening 56, through which the connecting member 71 may be disposed, may be defined through the second electrode CE2 of the storage capacitor Cst.

The gate electrode of the switching transistor T2 may be defined by a part of the scan line 151. A connecting electrode 73 connected to the data line 171 is connected to the source electrode of the switching transistor T2 through a contact hole 62.

The compensation transistor T3 includes a first compensation transistor T3-1 and a second compensation transistor T3-2 which are adjacent to each other. The gate electrode of the first compensation transistor T3-1 may be defined by a part of the scan line 151. The source electrode of the first compensation transistor T3-1 is connected to the source electrode of the light emission control transistor T6 and the drain electrode of the driving transistor T1.

The source electrode of the second compensation transistor T3-2 is connected to the drain electrode of the first compensation transistor T3-1. The gate electrode of the second compensation transistor T3-2 may be defined by a protrusion of the scan line 151. The connecting member 71 is connected to the drain electrode of the second compensation transistor T3-2 through a contact hole 63.

The initialization transistor T4 includes a first initialization transistor T4-1 and a second initialization transistor T4-2. The gate electrode of the first initialization transistor T4-1 and the gate electrode of the second initialization transistor T4-2 may be defined by a part of the previous scan line 152. The initialization voltage line 127 is connected to the source electrode of the first initialization transistor T4-1 through a contact hole 64. The connecting member 71 is connected to the drain electrode of the second initialization transistor T4-2 through the contact hole 63. The drain electrode of the first initialization transistor T4-1 is connected to the source electrode of the second initialization transistor T4-2.

The gate electrode of the operation control transistor T5 may be defined by a part of the light emission control line 153. A connecting member 74 connected to the driving voltage line 172 is connected to the source electrode of the operation control transistor T5 through a contact hole 65.

The gate electrode of the light emission control transistor T6 may be defined by a part of the light emission control line 153. A connecting member 72 is connected to the drain electrode of the light emission control transistor T6 through a contact hole 67.

The gate electrode of the bypass transistor T7 may be defined by a part of the previous scan line 152. The source electrode of the bypass transistor T7 is connected to the drain electrode of the light emission control transistor T6. The drain electrode of the bypass transistor T7 is connected to the source electrode of the first initialization transistor T4-1.

The storage capacitor Cst includes a first electrode CE1 and a second electrode CE2 overlapping each other with the second insulating layer 142 therebetween. The first electrode CE1 corresponds to the gate electrode 155 of the driving transistor T1, and the second electrode CE2 may be defined by an extended portion of a storage line 126.

An end of the connecting member 71 is connected to the first electrode CE1 of the gate electrode 155 through the contact hole 61 and the opening 56. Another end of the connecting member 71 is connected to the drain electrode of the second compensation transistor T3-2 and the drain electrode of the second initialization transistor T4-2 through the contact hole 63. Accordingly, the connecting member 71 may connect the gate electrode 155 of the driving transistor T1 to the drain electrode of the second compensation transistor T3-2 and the drain electrode of the second initialization transistor T4-2.

A connecting member 75 connected to the driving voltage line 172 is connected to the second electrode CE2 through a contact hole 66. The storage capacitor Cst may store a charge corresponding to a difference between the driving voltage ELVDD transmitted to the second electrode CE2 through the driving voltage line 172 and the gate voltage of the gate electrode 155.

A connecting member 76 is connected to the connecting member 72 through a contact hole 68, and the first electrode E1 (also referred to as a pixel electrode) is connected to the connecting member 76 through a contact hole 81.

The cross-sectional structure of an embodiment of the display device will hereinafter be described in terms of the order of stacking with reference to FIG. 8.

The buffer layer 120 is disposed on the substrate 110, and the semiconductor layer 130 including the channels, the source electrodes and the drain electrodes of the transistors T1 to T7 are disposed on the buffer layer 120. The above-described second dummy lines DMa2 and DMb2 and third dummy line DMb3 may be formed of a same material in a same process as the semiconductor layer 130. The second dummy lines DMa2 and DMb2 and the third dummy line DMb3 may be conductive by being doped with a higher impurity concentration than the impurity doped to the channel of the semiconductor layer 130.

The first insulating layer 141 is disposed on the semiconductor layer 130, and a first conductor including the gate electrode of the transistors T1 to T7, the scan line 151, the previous scan line 152, the light emission control line 153 and the first electrode CE1 is disposed on the first insulating layer 141.

The above-described first data connection line CLa1 and first driving connection line CLb1 may be formed of a same material and in a same process as the first conductor. In such an embodiment, the first conductor may further include the first data connection line CLa1 and the first driving connection line CLb1.

The second insulating layer 142 is disposed on the first conductor, and a second conductor including the storage line 126 and the second electrode CE2 is disposed on the second insulating layer 142.

The above-described second data connection line CLa2, second driving connection line CLb2, and third driving connection line CLb3 may be formed of a same material and in a same process as the second conductor. In such an embodiment, the second conductor may further include the second data connection line CLa2, the second driving connection line CLb2, and the third driving connection line CLb3.

The third insulating layer 161 is disposed on the second conductor, and contact holes 61 to 67 are defined through the third insulating layer 161.

A third conductor including the initialization voltage line 127 and the connecting members 71-75 is disposed on the third insulating layer 161.

The initialization voltage line 127 is connected to the source electrode of the first initialization transistor T4-1 through the contact hole 64 defined in the first, second, and third insulating layers 141, 142, and 161. An end of the connecting member 71 is connected to the first electrode CE1 through the contact hole 61 formed in the second and third insulating layers 142 and 161, and another end of the connecting member 71 is connected to the drain electrode of the second compensation transistor T3-2 and the drain electrode of the second initialization transistor T4-2 through the contact hole 63 defined in the first, second, and third insulating layers 141, 142, and 161. The connecting member 72 is connected to the drain electrode of the light emission control transistor T6 through the contact hole 67 defined in the first, second, and third insulating layers 141, 142, and 161. The connecting member 73 is connected to the source electrode of the switching transistor T2 through the contact hole 62 defined in the first, second, and third insulating layers 141, 142, and 161. The connecting member 74 is connected to the source electrode of the operation control transistor T5 through the contact hole 65 defined in the first, second, and third insulating layers 141, 142, and 161. The connecting member 75 is connected to the second electrode CE2 through the contact hole 66 defined in the first, second, and third insulating layers 141, 142, and 161.

The above-described first dummy lines DMa1 and DMb1 may be formed of a same material in a same process as the third conductor. In such an embodiment, the third conductor may further include the first dummy lines DMa1 and DMb1.

The fourth insulating layer 162 is disposed on the third conductor, and a fourth conductor including the data line 171, the driving voltage line 172 and the connecting member 76 is disposed on the fourth insulating layer 162.

The data line 171 is connected to the connecting member 73 through the contact hole defined in the fourth insulating layer 162, thereby being connected to the source electrode of the switching transistor T2. The driving voltage line 172 is connected to the connecting members 74 and 75 through the contact holes defined in the fourth insulating layer 162. Accordingly, the driving voltage line 172 may be connected to the source electrode of the operation control transistor T5, thereby being connected to the second electrode CE2.

The connecting member 76 is connected to the connecting member 72 through the contact hole defined in the fourth insulating layer 162, thereby being connected to the drain electrode of the light emission control transistor T6.

The fifth insulating layer 180 is disposed on the fourth conductor, and the first electrode E1 of the pixel electrode is disposed on the fifth insulating layer 180. The first electrode E1 is connected to the connecting member 76 through the contact hole 81 defined in the fifth insulating layer 180.

A sixth insulating layer 350 (also referred to as a pixel definition layer), in which the opening overlapping the first electrode E1 is defined, is disposed on the fifth insulating layer 180. The sixth insulating layer 350 may include an organic insulating material or an inorganic insulating material.

An emission layer EL is disposed on the first electrode E1. A second electrode E2 (also referred to as a common electrode) is disposed on the emission layer EL. The second electrode E2 may be disposed over a plurality of pixels PX.

The first electrode E1, the organic emission layer EL and the second electrode E2 collectively define a light emitting diode LED. The first electrode E1 may be an anode of a hole injection electrode and the second electrode E2 may be a cathode of an electron injection electrode, or vice versa. Holes and electrons are injected from the first electrode E1 and the second electrode E2 into the emission layer EL, and light emits when an exciton, which is formed when injected holes and electrons are combined, falls from an excited state to a ground state.

An encapsulation layer for protecting the light emitting diode LED may be disposed on the second electrode E2. The encapsulation layer may be in contact with the second electrode E2 or may be separated from the second electrode E2. The encapsulation layer may include an inorganic layer and an organic layer. A capping layer and/or a functional layer may be disposed between the second electrode E2 and the encapsulation layer.

The position and arrangement of the above-described elements may be variously modified.

Figure 9:
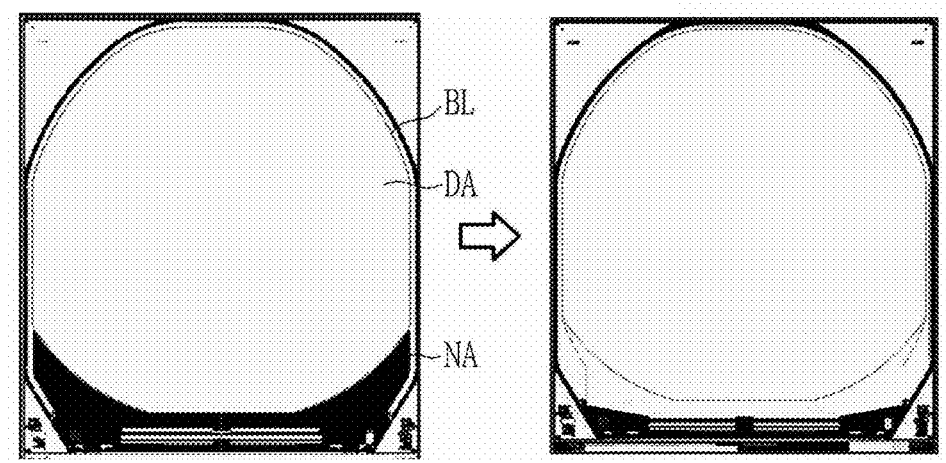
FIG. 9 is a view showing a semiconductor layer formation region before and after forming second dummy lines and third dummy lines in a non-display area of a display device according to an embodiment.
Figure 10:
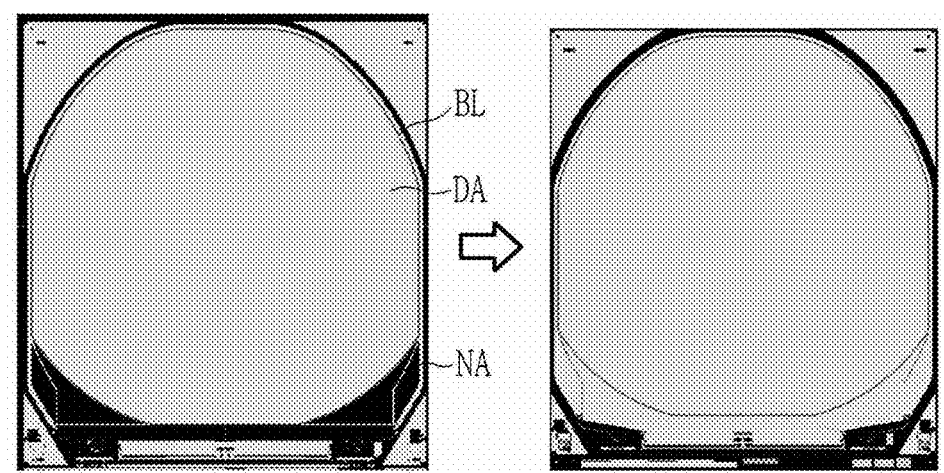
FIG. 10 is a view showing a specific conductive layer formation region before and after forming first dummy lines in a non-display area of a display device according to an embodiment.

FIG. 9 is a view showing a semiconductor layer formation region before and after forming second dummy lines DMa2 and DMb2 and third dummy lines DMb3 in a non-display area NA of a display device according to an embodiment, and FIG. 10 is a view showing a specific conductive layer formation region before and after forming first dummy lines DMa1 and DMb1 in a non-display area NA of a display device according to an embodiment.

In FIG. 9, a state before the display panel is manufactured and cut to be suitable to a size of a product is shown. The upper left and right corner portions in the display panel shown may be cut. The inner display area DA disposed inside based on the boundary BL is formed with rounded corners like a spectacle lens. Such a display panel may be applied to a head mounted display device.

In FIG. 9, a left drawing and a right drawing show a formation region of the semiconductor layer before and after disposing the above-described second dummy lines DMa2 and DMb2 and third dummy line DMb3 in the non-display area NA. In the drawing, the region represented by a black color is the region where the semiconductor layer does not exist. By disposing the second dummy lines DMa2 and DMb2 and the third dummy line DMb3, the semiconductor layer may be formed with a similar density to that of the display area DA even in the non-display area NA, particularly, the non-display area NA adjacent to the display area DA. Accordingly, when forming the semiconductor pattern (the above-described semiconductor layer 130) in the display area DA, the photo-loading effect may be resolved in the display area DA, particularly adjacent to the non-display area NA.

In FIG. 10, the left drawing and the right drawing represent the formation region of the specific conductive layer, that is, the conductive layer including the third conductor before and after disposing the above-described first dummy lines DMa1 and DMb1 in the non-display area NA. In the drawings, the region represented by the black color represents a region where the third conductor does not exist. By disposing the first dummy lines DMa1 and DMb1, the third conductor may be formed with a similar density to that of the display area DA even in the non-display area NA, particularly, the non-display area NA adjacent to the display area DA. Accordingly, when forming the third conductor in the display area DA, the photo-loading effect may be resolved in the display area DA, particularly adjacent to the non-display area NA.

While the invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:
1. A display device comprising a display panel including a display area, in which an image is displayed, and a non-display area around the display area, wherein the display panel includes:
   a substrate;
   a plurality of connection lines on the substrate in the non-display area and including a first connection line and a second connection line adjacent to each other;

a first dummy line overlapping the first connection line and disposed on the first connection line;
a second dummy line overlapping the second connection line and disposed between the substrate and the second connection line;
a first insulating layer disposed between the first connection line and the second dummy line;
a second insulating layer disposed between the first connection line and the second connection line; and
a third insulating layer disposed between the second connection line and the first dummy line.

2. The display device of claim 1, wherein
the first dummy line does not overlap the second connection line, and
the second dummy line does not overlap the first connection line.

3. The display device of claim 1, wherein
the first dummy line is connected to the first connection line through a contact hole defined in the second insulating layer and the third insulating layer.

4. The display device of claim 1, wherein
the second connection line is connected to the second dummy line through a contact hole defined in the first insulating layer and the second insulating layer.

5. The display device of claim 1, wherein
the display panel further includes a semiconductor layer disposed between the substrate and the first insulating layer in the display area, and
the second dummy line comprises a same material as the semiconductor layer.

6. The display device of claim 1, wherein
the display panel further includes a storage capacitor disposed in the display area,
the storage capacitor includes: a first electrode disposed between the first insulating layer and the second insulating layer; and a second electrode disposed between the second insulating layer and the third insulating layer,
the first connection line comprises a same material as the first electrode, and
the second connection line comprises a same material as the second electrode.

7. The display device of claim 1, wherein
the display panel further includes:
an initialization voltage line disposed on the third insulating layer in the display area, wherein the initialization voltage line transmits an initialization voltage; and
a fourth insulating layer disposed on the initialization voltage line and the first dummy line, and
the first dummy line comprises a same material as the initialization voltage line.

8. The display device of claim 7, wherein
the display panel further includes a data line disposed on the fourth insulating layer in the display area, wherein the data line transmits a data voltage, and
one of the first connection line and the second connection line is connected to the data line.

9. The display device of claim 7, wherein
the display panel further includes a scan line disposed between the first insulating layer and the second insulating layer in the display area, wherein the scan line transmits a scan signal, and
one of the first connection line and the second connection line is connected to the initialization voltage line, and the other of the first connection line and the second connection line is connected to the scan line.

10. The display device of claim 1, wherein
the plurality of connection lines further includes a third connection line adjacent to the second connection line, and
the display panel further includes a third dummy line overlapping the third connection line and disposed between the substrate and the third connection line.

11. The display device of claim 10, wherein
the display panel further includes a light emission control line disposed between the first insulating layer and the second insulating layer in the display area, wherein the light emission control line transmits a light emission control signal, and
the third connection line is connected to the light emission control line.

12. The display device of claim 1, wherein
the first dummy line and the second dummy line are alternately disposed one by one in a predetermined direction.

13. A display device comprising:
a display panel including a display area and a non-display area,
wherein the display panel includes:
a substrate;
a first insulating layer disposed on the substrate;
a first connection line disposed on the first insulating layer in the non-display area;
a second insulating layer disposed on the first connection line;
a second connection line disposed on the second insulating layer in the non-display area;
a third insulating layer disposed on the second connection line;
a fourth insulating layer disposed on the third insulating layer;
a first dummy line overlapping the first connection line; and
a second dummy line overlapping the second connection line.

14. The display device of claim 13, wherein
the first dummy line is disposed between the third insulating layer and the fourth insulating layer, and
the second dummy line is disposed between the substrate and the first insulating layer.

15. The display device of claim 13, wherein
the first dummy line is connected to the first connection line, and
the second dummy line is connected to the second connection line.

16. The display device of claim 13, further comprising:
an integrated circuit chip including a data driver, and
the first connection line and the second connection line transmit a data voltage output from the integrated circuit chip.

17. The display device of claim 13, further comprising:
a driving circuit disposed in the non-display area, and
at least one line selected from the first connection line and the second connection line transmits a signal output from the driving circuit.

* * * * *